(12) United States Patent
Koolhaas et al.

(10) Patent No.: US 6,803,610 B2
(45) Date of Patent: Oct. 12, 2004

(54) OPTIMIZED MEMORY CELL PHYSICAL ARRANGEMENT

(75) Inventors: Martin Koolhaas, Ottawa (CA); Matthew Dunn, Kanata (CA)

(73) Assignee: Mosaid Technologies Incorporated, Kanata (CA)

(*) Notice: Subject to any disclaimer, the term of this patent is extended or adjusted under 35 U.S.C. 154(b) by 0 days.

(21) Appl. No.: 10/259,804

(22) Filed: Sep. 30, 2002

(65) Prior Publication Data

US 2004/0061143 A1 Apr. 1, 2004

(51) Int. Cl.[7] .................. H01L 27/10; G11C 15/00
(52) U.S. Cl. .................. 257/204; 257/208; 365/49; 365/51

(58) Field of Search ................ 257/204, 208, 257/296, 338, 357, 368, 369, 351, 238; 365/49, 51, 63, 230.3

(56) References Cited

U.S. PATENT DOCUMENTS 6,563,727 B1 * 5/2003 Roth et al. .................. 365/49

* cited by examiner

Primary Examiner—Minhloan Tran
Assistant Examiner—Tan Tran
(74) Attorney, Agent, or Firm—Kevin Pillay; Owen Cramer (57) ABSTRACT

A semiconductor circuit array comprises a plurality of repetitive circuit blocks. Each of the circuit blocks comprises a plurality of functional circuit segments. Each of the functional circuit segments is physically oriented in on of a plurality of predetermined orientations independent of other functional circuit segment orientations in the circuit block.

5 Claims, 9 Drawing Sheets

OPTIMIZED MEMORY CELL PHYSICAL ARRANGEMENT

The present invention relates to a method and structure for an improved circuit element physical layout, and more particularly to a physical layout of semiconductor circuit blocks.

BACKGROUND OF THE INVENTION

Conventional content addressable memory (CAM) is implemented primarily using static random access memory (SRAM) cells. SRAM-based CAMs have received widespread use due to the high access speed and static nature of SRAM memory cells. Furthermore, SRAM cells can be manufactured using a pure-logic type fabrication process, which is commonly used for non-memory circuit blocks.

While they have random access memory (RAM) functionality of storing data, CAMs are predominantly used for searching. The search data is compared with stored data in order to determine if the stored data matches search data applied to the memory. When newly applied search data matches data stored in the memory, a match result is indicated. If the searched and stored data do not match, a mismatch result is indicated. CAMs are particularly useful for fully associative memories such as look-up tables and memory-management units.

Many current applications utilise ternary CAMS, which are capable of storing three logic states. For example, three logic states are logic '0', logic '1' and "don't care". Therefore, such CAM cells require two memory cells to store the logic states as well as a comparison circuit for comparing stored data with search data provided to the CAM.

In ternary form, each conventional SRAM-based CAM memory cell comprises a typical six-transistor (6T) SRAM cell. That is, each SRAM cell requires 2 p-channel transistors and 2 n-channel transistors in a cross-coupled inverter relationship and a further 2 n-channel transistors as access devices to associated bit lines. Therefore, an SRAM-based ternary CAM cell typically consists of 12 transistors to implement the two 6T SRAM cells. Furthermore, four additional transistors are required for each ternary CAM memory cell for implementing an exclusive-NOR function for comparing the search data with the stored data.

When implementing a physical, device-level layout of an SRAM-based CAM cell circuit in semiconductor material, the main goal is to minimize physical area occupied by each cell while maintaining optimal circuit design functionality and performance. It is the task of the physical layout designer to create the smallest cell layout possible while satisfying both the integrated circuit (IC) manufacture's layout design rules and the circuit designer's specifications. As the cell layout is repeated numerous times to create a memory array, even a small reduction in the cell size results, cumulatively, in a significant reduction in overall die size and power consumption.

It is recognized that a factor in improving the performance of the CAM, is to share common circuit nodes, such as a matchline node, between neighboring cells. Sharing the matchline node contact between adjacent cells, for example, minimizes the area taken by each cell as well as reduces the overall parasitic capacitance of the matchline, since the number of contacts per matchline is reduced.

For clarity, throughout this document, the term "tiling" refers to maintaining the same orientation of a cell as it is repeated in a two dimensional array. The term "mirroring" refers to flipping the cell along a vertical or horizontal axis for each subsequent instantiation of the cell in the array.

In the past, CAM cells have been laid out with shared nodes on a boundary between neighbouring cells. Practical layouts generally tend to share as many nodes as possible in order to reduce area and signal line parasitic capacitance. Some nodes must be shared by mirroring the cell along an axis, while other nodes, such as power nodes, can be shared by either mirroring or tiling cells along an axis. As an example, a power node may be shared between four cells when placed at an intersection of two axes. Accordingly, efficient CAM cell designs make effective use of these contact-sharing techniques.

Often when utilizing contact or node sharing techniques, a decision between tiling and mirroring along a vertical and horizontal axis must be made. The positive and negative aspects of each option must be considered before deciding on a solution. For example, mirroring may allow for more sharing, but may crowd internal connections in the cell layout, thus requiring an increase in the size of the cell along its perpendicular axis. Conversely, tiling may not allow as much node sharing to occur as in a mirrored layout approach, but tiling will most likely not result in crowded internal connections in the cell layout, thus allowing for a smaller cell size.

Using the techniques applied in the art rarely results in an optimum solution since in each case a negative aspect compliments each positive aspect. While many conventional approaches effectively reduce cell size, there is still room for further improvement. Thus, it is an object of the present invention to further improve cell size while maintaining common node sharing between cells.

SUMMARY OF THE INVENTION

In accordance with an aspect of the invention there is provided a semiconductor circuit array having a plurality of memory cells. Each of the memory cells includes a first, a second, a third and a fourth segments. The first and second segments form a first half of a memory cell and the third and fourth segments form a second half of a memory cell. The third segment is a mirror image of the first segment, and the fourth segment is a tiled image of the second segment.

The present invention seeks to provide a cell that achieves maximum performance with minimum size.

An advantage of the present invention is to provide a layout of CAM cells that optimizes node sharing while reducing the die size of the cell.

A further advantage of the present invention is to provide a layout that optimizes node sharing, reduces the die size of the cell, and complies with the layout design rules.

Yet a further advantage of the present invention is to provide a cell layout that reduces parasitic capacitance, resistance and leakage current.

BRIEF DESCRIPTION OF THE DRAWINGS

Embodiments of the present invention will now be described by way of example only, with reference to the following drawings in which.

DETAILED DESCRIPTION OF PREFERRED EMBODIMENTS

Figure 1:
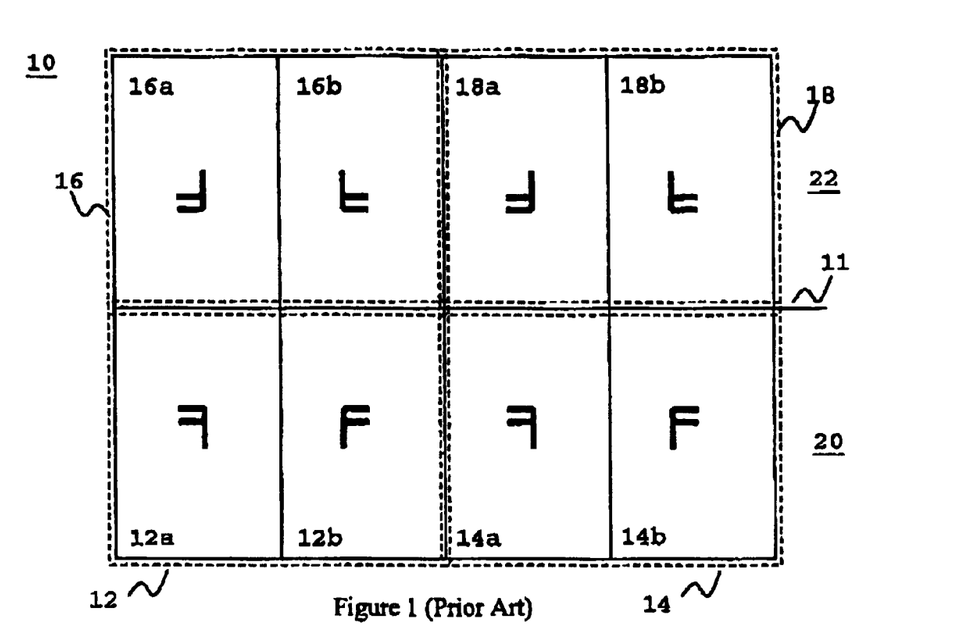
FIG. 1 illustrates a schematic diagram of a CAM cell orientation in accordance with the prior art.

Referring to FIG. 1, a prior art orientation of a small portion of an array of cells in a CAM is illustrated generally by numeral 10. Four ternary cells 12, 14, 16, and 18 of the CAM array portion 10 are shown. Two ternary cells 12 and 14 are part of a lower row 20 of the CAM array portion 10. Two ternary cells 16 and 18 are part of an upper row 22 of the CAM array portion 10. The ternary cell 12 is comprised of a first half-cell 12a and a second half-cell 12b. Similarly, the other ternary cells 14, 16, and 18 are each comprised of half-cells 14a, 14b, 16a, 16b, 18a, and 18b respectively. Each half-cell has the capacity to store one bit, so the ternary cells 12, 14, 16, and 18 are two-bit cells. The general orientation of components that form the cell, that is the orientation of the transistors in each half-cell, is represented as a letter "F" in the drawings, as is common in physical layout diagrams to indicate element orientation.

The first half-cell 12a of the ternary cell 12 is used as a base for the layout. The second half-cell 12b is a mirror image of the first half-cell 12a, mirrored along a vertical axis. The adjacent cell 14 is formed by tiling cell 12. The lower row 20 is then mirrored along a horizontal axis 11 for forming the upper row 22. As can be seen, the orientation of the half-cells in one row is a mirror image of the half-cells in an adjacent row about the horizontal axis 11. Similarly, the orientation of the half-cells in a particular column is a mirror image of the half-cell in an adjacent column about a vertical axis. This mirroring layout approach achieves a high node-sharing layout since all of the half-cells have adjacent corresponding edges. However, the node sharing may result in crowding of certain circuit elements within each half-cell, thereby increasing overall cell size.

Figure 2:
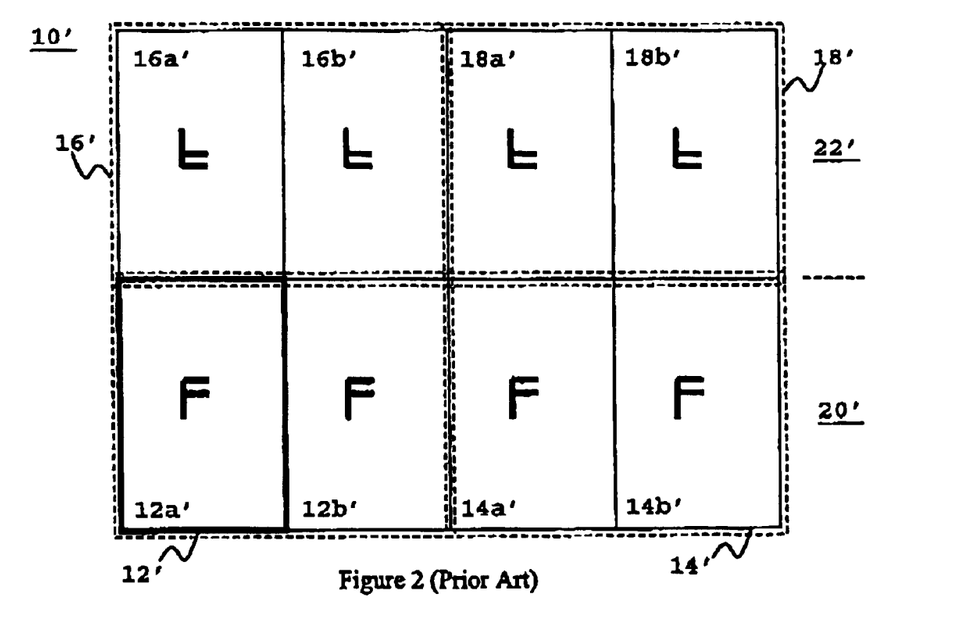
FIG. 2 illustrates a schematic diagram of an alternate CAM cell orientation in accordance with the prior art.

Referring to FIG. 2 an alternate prior art orientation of the cells in a CAM array portion is illustrated generally by numeral 10'. For ease of description, the numerals are the same as described with reference to FIG. 1 with the addition of a prime (') symbol. Once again, the first half-cell 12a' is used as a base for the layout. In the present orientation, however, the second half-cell 12b' is not mirrored but tiled on its vertical axis. As a result, both halves 12a' and 12b' of cell 12' have the same orientation. The lower row 20' is formed by tiling cell 12' resulting in half-cells 12a', 12b', 14a', and 14b' all having the same orientation. The upper row 22' is formed by mirroring the lower row 20' about a horizontal axis 11. This design achieves a very compact design of the cell but does not allow for node sharing and the benefits associated therewith.

A solution to this problem is achieved by observing that a memory cell is comprised functionally of a search portion and a storage portion. Thus in accordance with an embodiment of the invention there is provided a memory half-cell that is hierarchically subdivided into a search portion and a storage portion. The two portions of the half-cell are separately oriented to take advantage of both mirroring and tiling layout techniques. Specifically, the search portion of adjacent half-cells is mirrored in order to maximize the node sharing between adjacent half-cells, while the storage portion of adjacent half-cells tiled in order to minimize the size of the cell.

Previously, SRAM CAM cells were designed as a single half-cell or a single full cell and then duplicated to create the required size of memory. In the present solution, a typical half-cell memory is subdivided in two further portions. Although the half-cell is not necessarily physically separated into to portions, each of the portions is referred to as separate for the purpose of its orientation. Thus, the orientation of one portion of a half-cell may be changed independently of the orientation of the other portion of the same half-cell. One portion of the cell can be tiled when tiling provides a more effective result, while the other portion of the cell can be mirrored when mirroring provides a more effective result, thus reducing the negative effects of having an entire half-cell either mirrored or tiled and suffering the disadvantages of either approach.

Figure 3A:
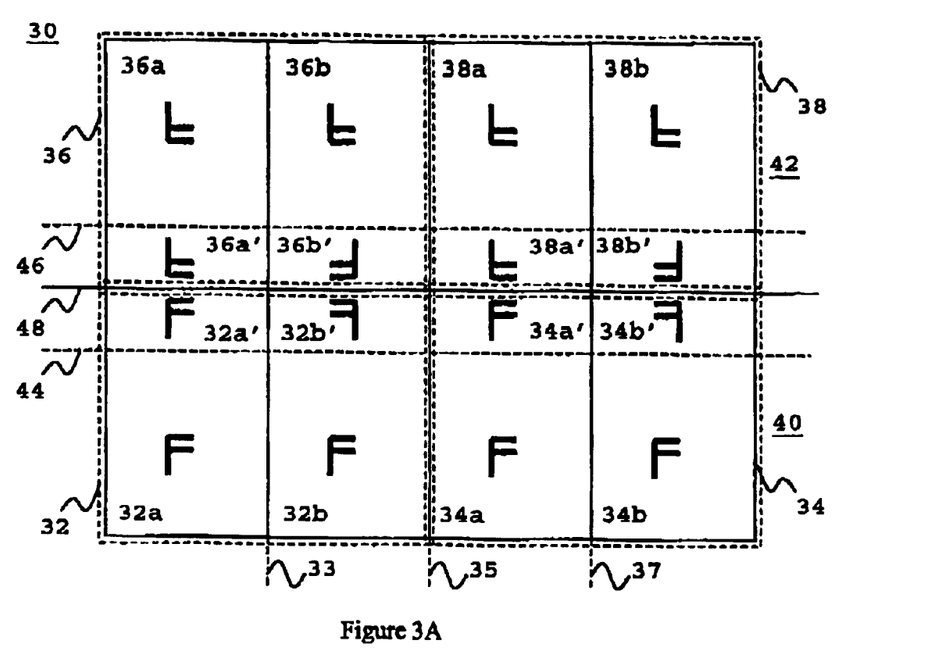
FIG. 3A illustrates a schematic diagram of a CAM cell orientation in accordance with an embodiment of the present invention.

Referring to FIG. 3A an orientation of the cells in a CAM in accordance with an embodiment of the invention is illustrated generally by numeral 30. Similarly to FIGS. 1 and 2, four ternary cells 32, 34, 36, and 38 of CAM array portion 30 are shown. Two ternary cells 32 and 34 are part of a lower row 40 of CAM array portion 30. Two ternary cells 36 and 38 are part of an upper row 42 of CAM array portion 30. Each ternary cell is comprised of two half-cells. Further, each half-cell comprises a search portion and storage portion. A first cell 32 is used as a base for the layout. The first cell 32 comprises two half-cells. A first half-cell includes a search portion 32a' and a storage portion 32a. A second half-cell comprises a search portion 32b' and a storage portion 32b. For illustrative purposes, a dashed horizontal line 44 is used to show the division between the search and storage portions in the CAM cells on the lower row 40. Similarly, a dashed horizontal line 46 is used to show the division between the search and storage portions in the CAM cells on the upper row 42. A solid line 48 divides the lower 40 and upper 42 rows. It will be apparent to one skilled in the art that the dashed and solid lines 46 and 48 are only used to conceptually describe the subdivision of the half-cells and do not in fact form a part of the actual cell layout.

As illustrated in FIG. 3A, the first half of the cell 32 is similar to the first half 12a' of the cell 12' illustrated in FIG. 2, since the search portion and the storage portion are both oriented the same way. However, in order to complete the full cell, the second half-cell is not laid out by simply duplicating and re-orienting the first half-cell as shown in either FIG. 1 or 2 reflecting the prior art approach. Rather, each portion 32a and 32b of the first half-cell is independently re-oriented to produce the second half-cell layout 32a' and 32b', in order to enhance both node-sharing efficiency and minimize cell area requirements. For example, the storage portion 32a of the first half-cell is tiled to form the storage portion 32b of the second half-cell. This reduces the overall size of the cell. The search portion 32a' is mirrored about the vertical axis 33 to form the search portion 32b', where sharing the nodes is very important for reducing matchline parasitic capacitance. Such selective tiling of the storage portion and mirroring of the search portion is repeated in order to form the adjacent cell 34 in the lower row 40. Thus, search portion 34a' is a mirror image of search portion 32b' and search portion 34b' is a mirror image of search portion 34a'. Storage portions 34a and 34b are tiled images of storage portions 32a.

The lower row 40 is mirrored about the horizontal axis 48 to form the upper row 42. As illustrated, the search portions 36a', 36b', 38a' and 38b' of the upper row are mirror images of storage portions 32a', 32b', 34a' and 34b' in the lower row about the horizontal axis 48. Further, the search portions 36a', 36b', 38a' and 38b' of the upper row are mirror images of each other about vertical axes 33, 35 and 37 respectively. Similarly, storage portions 36a, 36b, 38a and 38b are horizontal mirror images of storage portions 32a, 32b, 34a and 34b respectively and are tiled about the vertical axes 33, 35 and 37.

Conceptually separating the search portion and the storage portion provides the advantage that the orientation of the search portion of a cell can be changed by re-orienting it along a vertical or horizontal axis independently from the orientation of a corresponding storage portion, without affecting the functionality of the circuit. Furthermore, this unique layout allows part of a half-cell to be mirrored while another part of the same half-cell is tiled, all along the same axis. It is this flexibility that allows the design to capitalize on a maximum number of sharing benefits while reducing the previously associated downfall of increased cell size. For this solution, the matchlines, searchlines, wordlines, bitlines and power/ground connections are shared, without compromising the area required to make the internal connections.

Figure 3B:
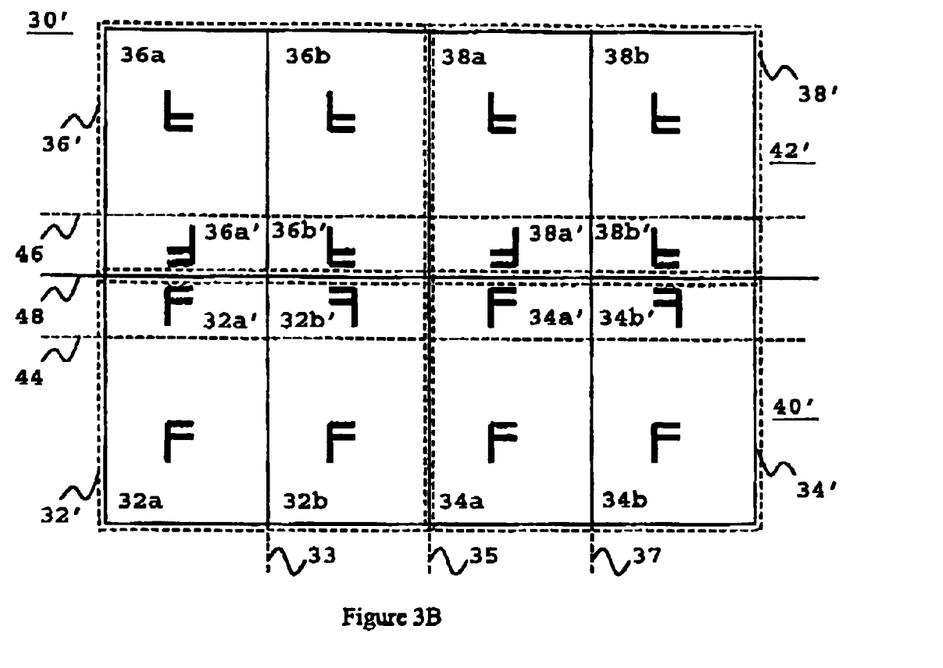
FIG. 3B illustrates a schematic diagram of a CAM cell orientation in accordance with a second embodiment of the present invention.

Referring to FIG. 3B an orientation of the cells in a CAM in accordance with an alternate embodiment of the invention is illustrated generally by numeral 30'. For ease of description similar numerals have been used for similar components to those in FIG. 3A. Similarly to FIG. 3A, four ternary cells 32', 34', 36', and 38' of CAM array portion 30' are shown. Two ternary cells 32' and 34' are part of a lower row 40' of the CAM array portion 30'. Two ternary cells 36' and 38' are part of an upper row 42' of the CAM array portion 30'. The difference with respect to FIG. 3A is that the orientations of the search portions 36a', 36b', 38a' and 38b' on the upper row 42' are both a horizontal and vertical mirror image of the orientation of the respective search portions 32a, 32b, 34a and 34b on the lower row 40'. The orientation of the search portions results when twisting of bitlines connected to each half-cell is employed. Twisting bitlines is a well-known technique used in memory layout design for equalizing crosstalk between the bitlines. The specific layout of the cells shown in FIG. 3B with twisted bitlines are illustrated and will be discussed in greater detail with reference to FIG. 6.

Figure 4A:
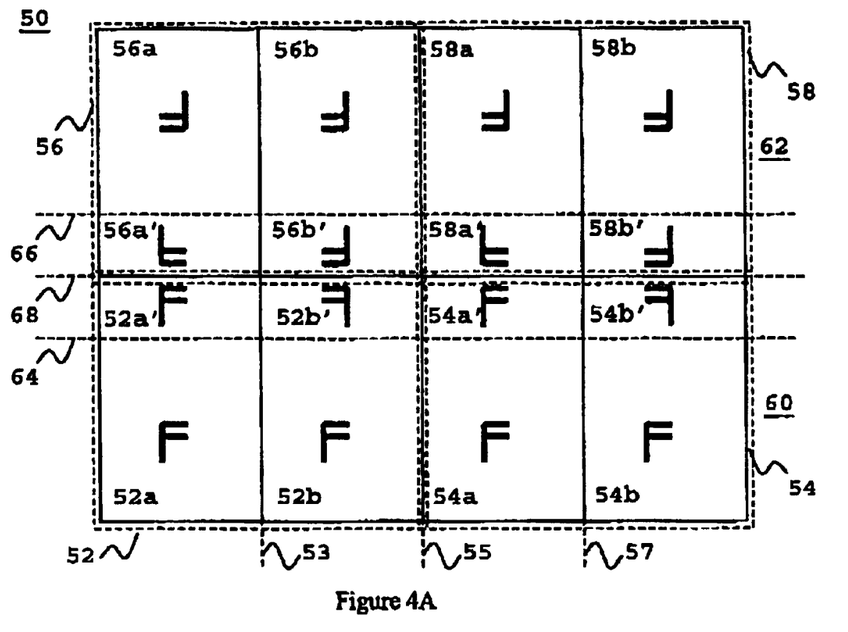
FIG. 4A illustrates a schematic diagram of a CAM cell orientation in accordance with a third embodiment of the present invention.

Referring to FIG. 4A an orientation of the cells in a CAM in accordance with yet an alternate embodiment of the invention is illustrated generally by numeral 50. In the present embodiment, the CAM 50 is similar to the CAM array portion 30 illustrated in FIG. 3A. Similarly to FIG. 3A, four ternary cells 52, 54, 56, and 58 of the CAM array portion 50 are shown. Two ternary cells 52 and 54 are part of a lower row 60 of the CAM array portion 50. Two ternary cells 56 and 58 are part of an upper row 62. Each ternary cell is comprised of two half-cells. Further, each half-cell comprises a search portion and storage portion. A first cell 52 is used as a base for the layout. The difference with respect to FIG. 3A is that in the present embodiment, the orientations of storage portions 56a, 56b, 58a and 58b on the upper row 62 are both a horizontal and vertical mirror image of the orientation of respective storage portions 52a, 52b, 54a and 54b on the lower row 50. It should be noted that the storage portions of the lower row cells 52a, 52b, 54a, 54b, as well as the storage portions of the upper row, 56a, 56b, 58a, 58b are all tiled. The search portions of the lower row cells, 52a', 52b', 54a', 54b', as well as the search portions of the upper row, 56a', 56b', 58a', 58b' are all mirrored. Similar to the previous embodiment, this particular orientation of the cells requires a twisted bitline layout.

Figure 4B:
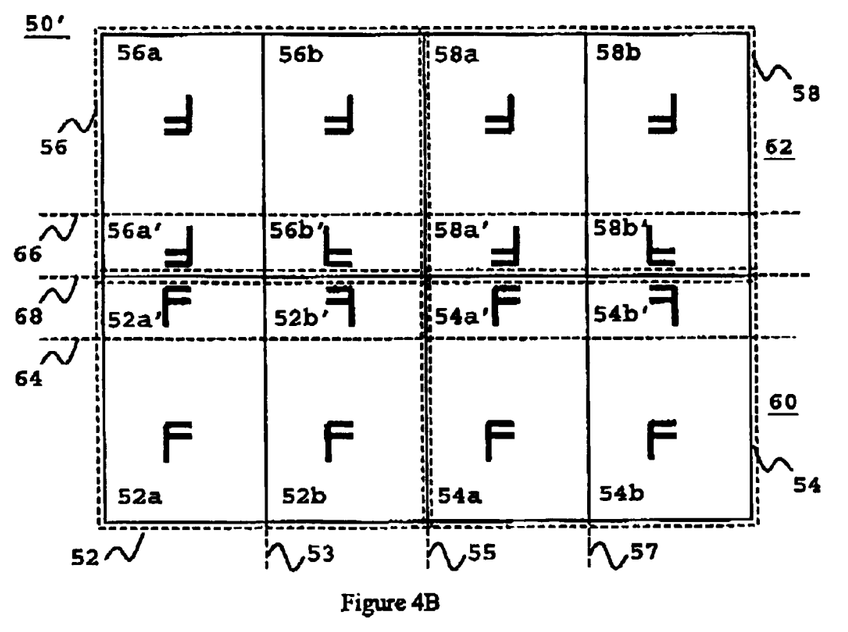
FIG. 4B illustrates a schematic diagram of a CAM cell orientation in accordance with a fourth embodiment of the present invention.

Referring to FIG. 4B an orientation of the cells in a CAM in accordance with yet an alternate embodiment of the invention is illustrated generally by numeral 50'. In the present embodiment, the orientation of the cells in the CAM 50' is similar to a combination of the orientation of the cells in CAM array portions 50 and 30 illustrated in FIGS. 4A and 3B. For ease of description the same numerals have been used for similar components to those in FIGS. 4A and 3B. Four ternary cells 52, 54, 56, and 58 of the CAM array portion 50' are shown. Two ternary cells 52 and 54 are part of a lower row 60 of CAM array portion 50'. Two ternary cells 56 and 58 are part of an upper row 62 of CAM array portion 50'. Each ternary cell is comprised of two half-cells. Further, each half-cell comprises a search portion and storage portion. A first cell 52 is used as a base for the layout.

The orientation of the storage portion for the present embodiment is similar to that in FIG. 4A. That is, the orientation of each storage portion across a row is a tiled image of the orientation of an adjacent storage portion about a vertical axis. Further, the orientation of the storage portions 56a, 56b, 58a and 58b on the upper row 62 is mirror image of the orientation of the respective storage portions 52a, 52b, 54a and 54b on the lower row 60 about both a horizontal and vertical axis.

The orientation of the search portion for the present embodiment is similar to that in FIG. 3B. That is, the orientation of each search portion across a row is a mirror image of the orientation of an adjacent search portion about a vertical axis. Further, the orientation of the search portions 56a', 56b', 58a' and 58b' on the upper row 62 is mirror image of the orientation of the respective search portions 52a', 52b', 54a' and 54b' on the lower row 60 about both a horizontal and vertical axis. The orientation of the search portions results in a twisted bitline design in the layout, as will be illustrated in greater detail with reference to FIG. 8.

Figure 5:
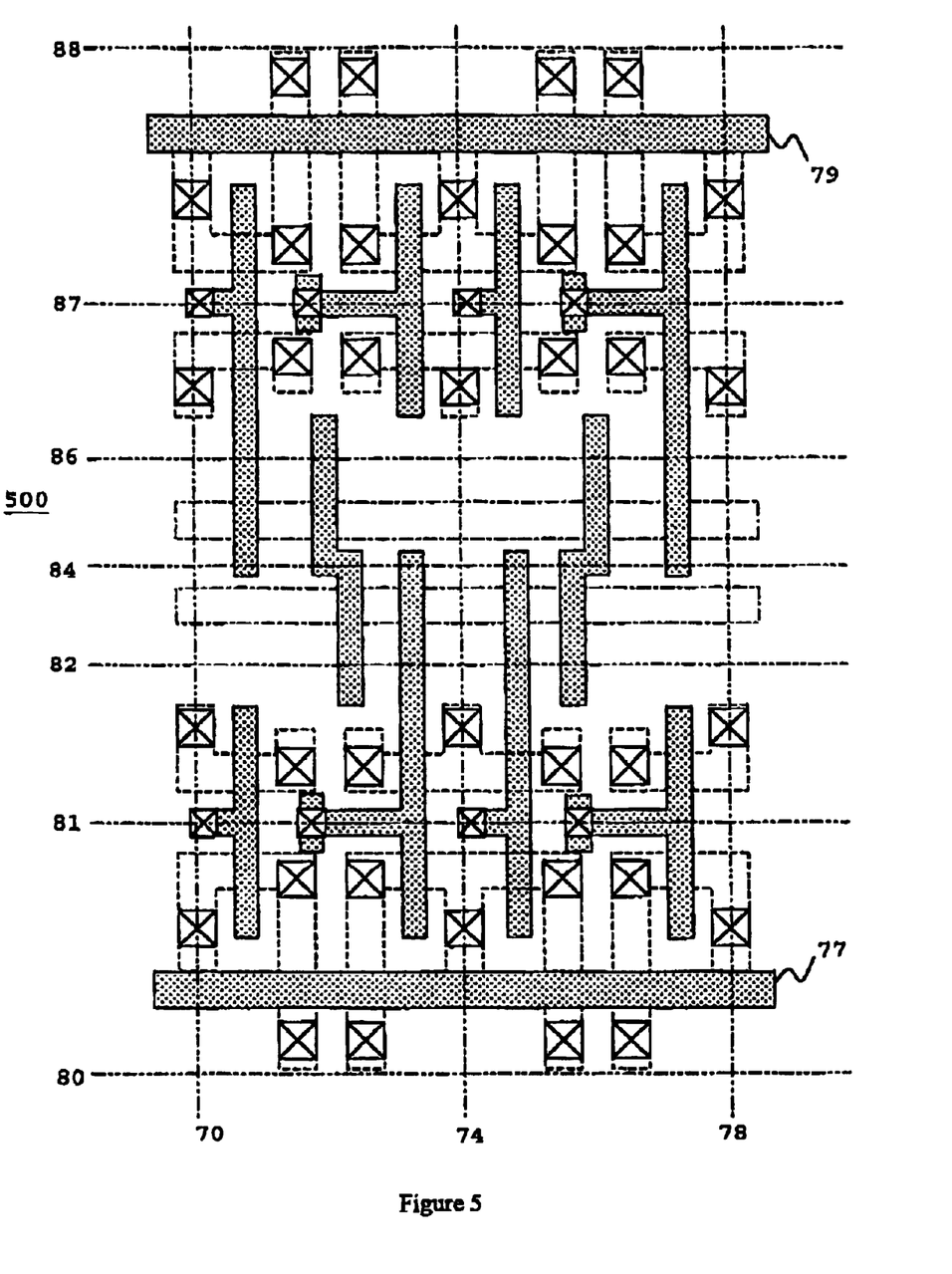
FIG. 5 illustrates a schematic diagram of a physical layout of the CAM cell orientation illustrated in FIG. 3B.

Referring to FIG. 5 a physical layout of two ternary SRAM-based CAM cells in accordance with an embodiment of the present invention is illustrated generally by numeral 500. Specifically, the layout 500 corresponds to the orientation illustrated in FIG. 3B. For convenience, broken lines enclose regions representing active semiconductor areas (for example, diffusion or ion-implanted areas). These areas include p-type active regions and n-type active regions. The regions between horizontal axes 80 and 81, between axes 82 and 86, and between axes 87 and 88 represent p-well regions. The regions between horizontal axes 81 and 82 and between axes 86 and 87 represent n-well regions.

Solid, continuous lines enclosing a "spotted" pattern region, represent a polysilicon layer. Metal contacts are represented by squares with an "X" symbol contained therein. A metal 1 layer (not shown) provides a metal interconnect between the plurality of metal contacts. As will be apparent to a person skilled in the art, there are other higher metal layers that are also not illustrated for simplicity.

Generally, the storage portion of each half-cell is located between horizontal axes 80 and 82 for the lower cells and horizontal axis 86 and 88 for the upper cells respectively. For example, the storage portion 32a of the first half of the ternary cell 32' is located between horizontal axes 80 and 82 and vertical axes 70 and 74. As illustrated by the layout of the active semiconductor regions, the storage portion in the first half-cell is tiled with respect to vertical axis 74 to form the storage portion 32b of the second half of the ternary cell 32'. The storage portion 32b of the second half of the ternary cell 32' is located between horizontal axes 80 and 82 and vertical axes 74 and 78. For the upper cells, the storage portion is a mirror image about horizontal axis 84 with respect to the storage portion of each corresponding lower cell.

Generally, the search portion of each half-cell is located between horizontal axes 82 and 84 for the lower cells and horizontal axis 84 and 86 for the upper cells respectively. For example, the search portion 32a' of the first half of the ternary cell 32' is located between horizontal axes 82 and 84 and vertical axes 70 and 74. As illustrated by the layout of the active and semiconductor regions, the search portion in the first half-cell is mirrored about the vertical axis 74 to form the search portion 32b' of the second half of the ternary cell 32'. The search portion 32b' of the second half of the ternary cell 32' is located between horizontal axes 82 and 84 and vertical axes 74 and 78. For the upper cells, the search portion is a mirror image about both the horizontal axis 84 and the vertical axis 74 to form an image rotated 180 degrees with respect to the search portion of each corresponding lower cell. Also illustrated in this figure are portions of wordlines 77 and 79, corresponding to the lower and upper rows 40' and 42' respectively.

From the layout illustrated in FIG. 5, it will be apparent to a person skilled in the art that a further size reduction is attained as the search portions are mirrored about both axes in such a way that polysilicon gate segments have ample spacing between upper and lower rows. Therefore poly-to-poly spacing between upper and lower half-cells is not an issue. Thus, it is possible to fit a more efficient cell in a smaller area. Using this method, all shareable nodes within an SRAM CAM cell are shared. This includes the power/ground nodes, matchline, searchline, bitline and wordline. In the prior art, if the matchline was shared the cell size would increase. Using the layout of the present embodiment it is possible to keep the size of the cell to a minimum by tiling the six-transistor (6T) SRAM portion of a half-cell, while sharing the matchline through mirroring the search stack. This results in optimal performance and a minimal area, which are two main objectives in memory design.

The primary advantages to this solution are that all sharable nodes are shared and internal connections share space with neighboring cells, reducing overall die size and increasing performance. Also, using mirrored search portions on both axes, the ground connection to the search portion can be routed in a metal 1 layer, leaving space for an additional metal 2 signal. In one design, the additional track of metal 2 is used to make a second connection to the searchline, thereby increasing performance, symmetry and reliability of the searchline signal.

Figure 6:
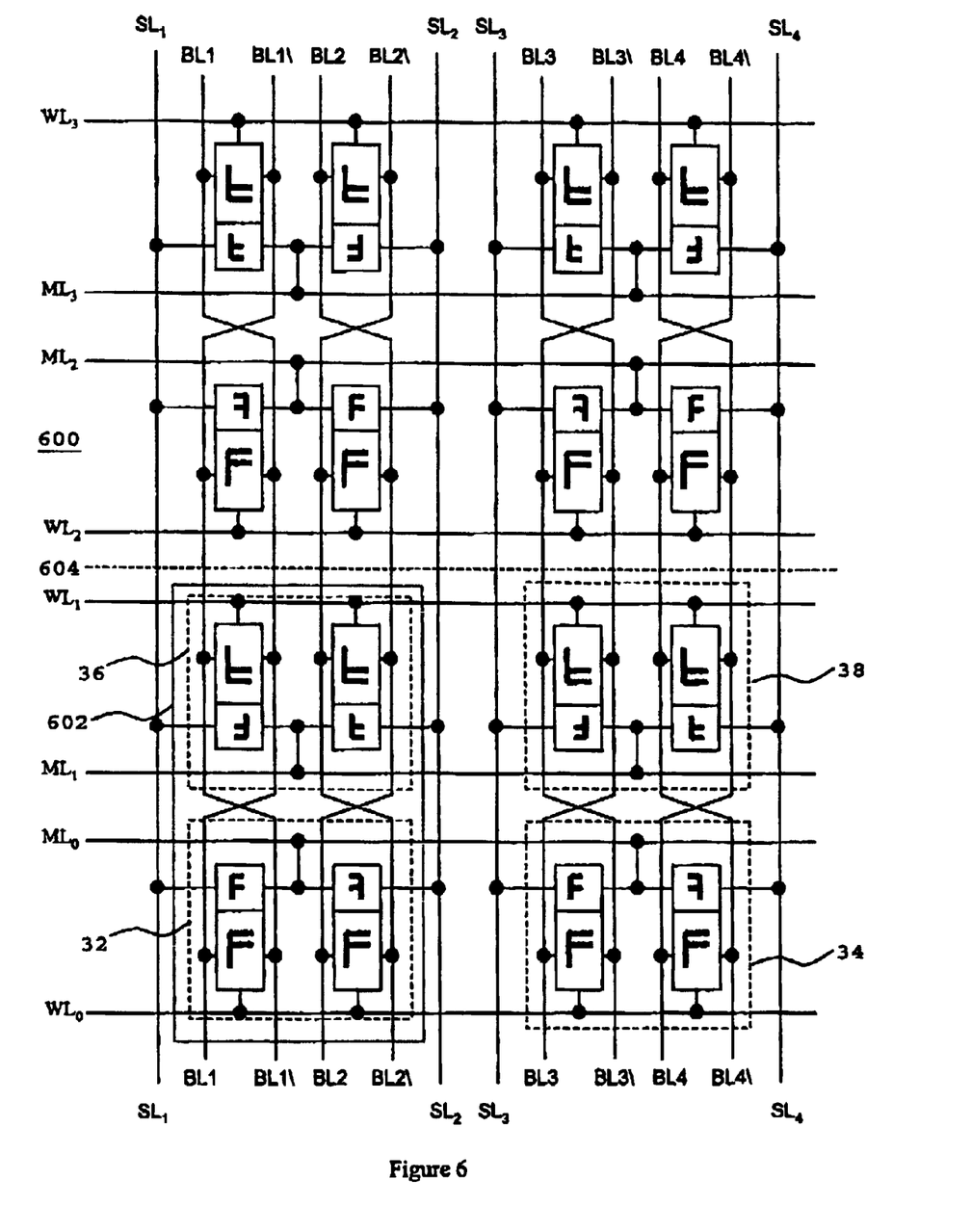
FIG. 6 illustrates a schematic diagram of a simplified CAM cell array implementing the CAM cell orientation illustrated in FIG. 3B.

Referring to FIG. 6, the CAM array portion layout illustrated in FIGS. 3B and 5 is illustrated generally by numeral 600. The CAM array portion 600 includes bitlines BL1, BL1\, BL2, BL2\, BL3, BL3\, BL4, and BL4\, searchlines $SL_0$, $SL_1$, $SL_2$, and $SL_3$, wordlines $WL_0$, $WL_1$, $WL_2$, and $WL_3$, and matchlines $ML_0$, $ML_1$, $ML_2$, and $ML_3$. In FIG. 6, a larger "F" illustrates the storage portion of each half-cell and a smaller "F" illustrates the search portion of each half-cell. Cells 32', 34', 36', and 38' from FIG. 3B are shown for reference. The combination of cells 32' and 34' are used as a base unit 602 for the layout of the CAM cell array portion 600. The base unit 602 is tiled to extend the CAM cell array portion 600 in a horizontal direction. To extend the CAM cell array portion 600 in a vertical direction, the base unit 602 is mirrored about a vertical axis 604.

Figure 7:
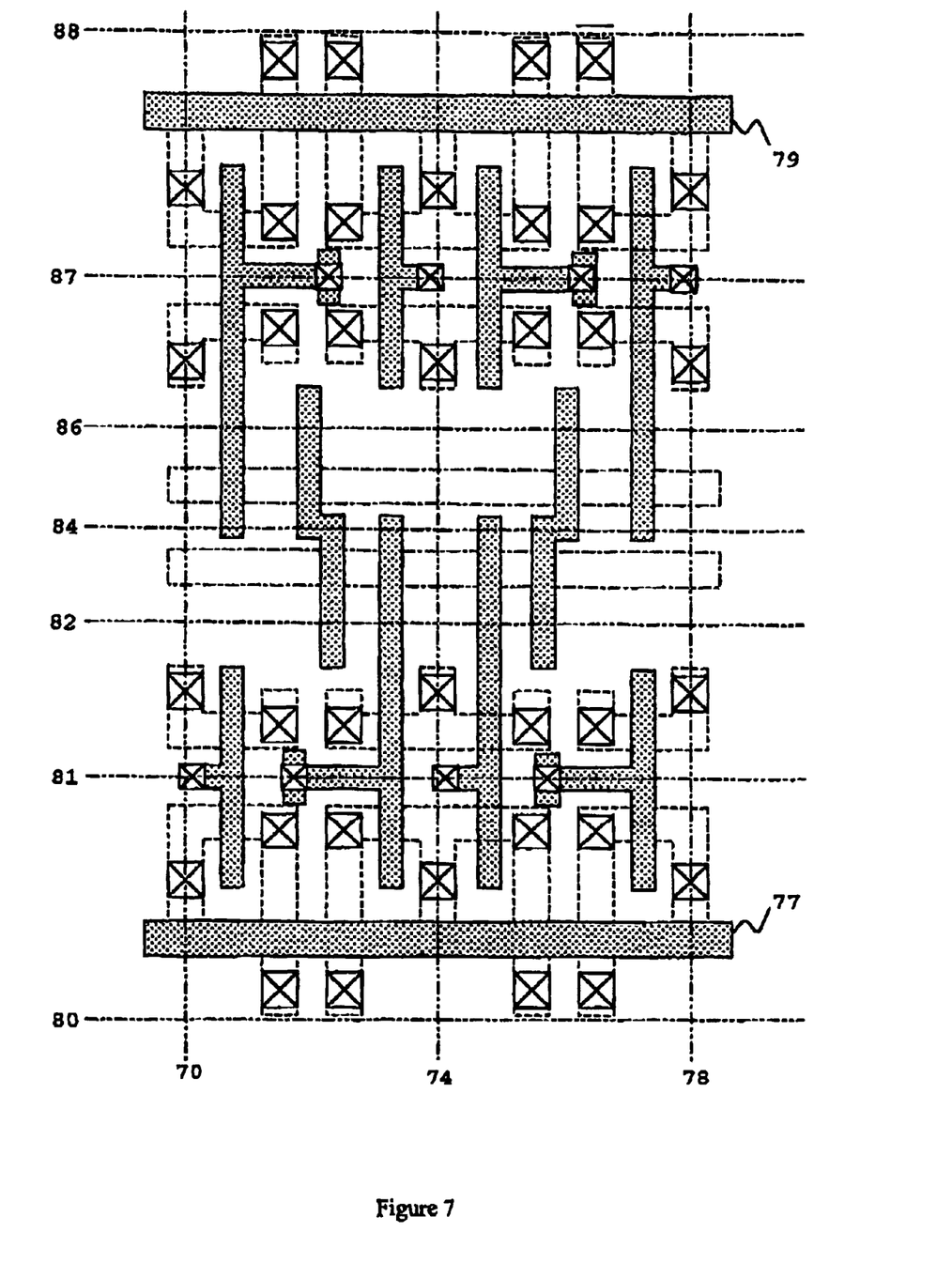
FIG. 7 illustrates a schematic diagram of a layout of the CAM cell orientation illustrated in FIG. 4B.

Referring to FIG. 7 a layout of two ternary SRAM-based CAM cells in accordance with yet an alternate embodiment of the present invention is illustrated generally by numeral 700. Specifically, the layout 700 corresponds to the orientation illustrated in FIG. 4B. As in FIG. 5, broken lines enclose regions representing active semiconductor areas (for example, diffusion or ion-implanted areas). These areas include p-type active regions and n-type active regions. The regions between horizontal axes 80 and 81, between axes 82 and 86, and between axes 87 and 88 represent p-well regions. The regions between horizontal axes 81 and 82 and between axes 86 and 87 represent n-well regions.

Solid, continuous lines enclosing a "spot pattern" fill represent a polysilicon layer. Metal contacts are represented by squares with an "X" symbol contained therein. A metal 1 layer (not shown) provides a metal interconnect between the plurality of metal contacts. As will be apparent to a person skilled in the are, there are other higher metal layers that are also not illustrated for simplicity.

Generally, the storage portion of each half-cell is located between horizontal axes 80 and 82 for the lower cells and horizontal axis 86 and 88 for the upper cells respectively. For example, the storage portion 52a of the first half of ternary cell 52 is located between horizontal axes 80 and 82 and vertical axes 70 and 74. As illustrated by the layout of the active semiconductor regions, the storage portion in the first half-cell is tiled with respect to vertical axis 74 to form the storage portion 52b of the second half of the ternary cell 52. The storage portion 52b of the second half of the ternary cell 52 is located between horizontal axes 80 and 82 and vertical axes 74 and 78. For the upper cells, the storage portion is a mirror image about both the horizontal axis 84 and the vertical axis 74 to form an image rotated 180 degrees with respect to the storage portion of each corresponding lower cell.

Generally, the search portion of each half-cell is located between horizontal axes 82 and 84 for the lower cells and horizontal axis 84 and 86 for the upper cells respectively. For example, the search portion 32a' of the first half of the ternary cell 52 is located between horizontal axes 82 and 84 and vertical axes 70 and 74. As illustrated by the layout of the active semiconductor regions, the search portion in the first half-cell is mirrored about the vertical axis 74 to form the search portion 32b' of the second half of the ternary cell 52. The search portion 32b' of the second half of the ternary cell 52 is located between horizontal axes 82 and 84 and vertical axes 74 and 78. For the upper cells, the search portion is a mirror image about both the horizontal axis 84 and the vertical axis 74 to form an image rotated 180 degrees with respect to the search portion of each corresponding lower cell. Also illustrated in this figure are wordlines 77 and 79, corresponding to the lower and upper rows 40'and 42' respectively.

Figure 8:
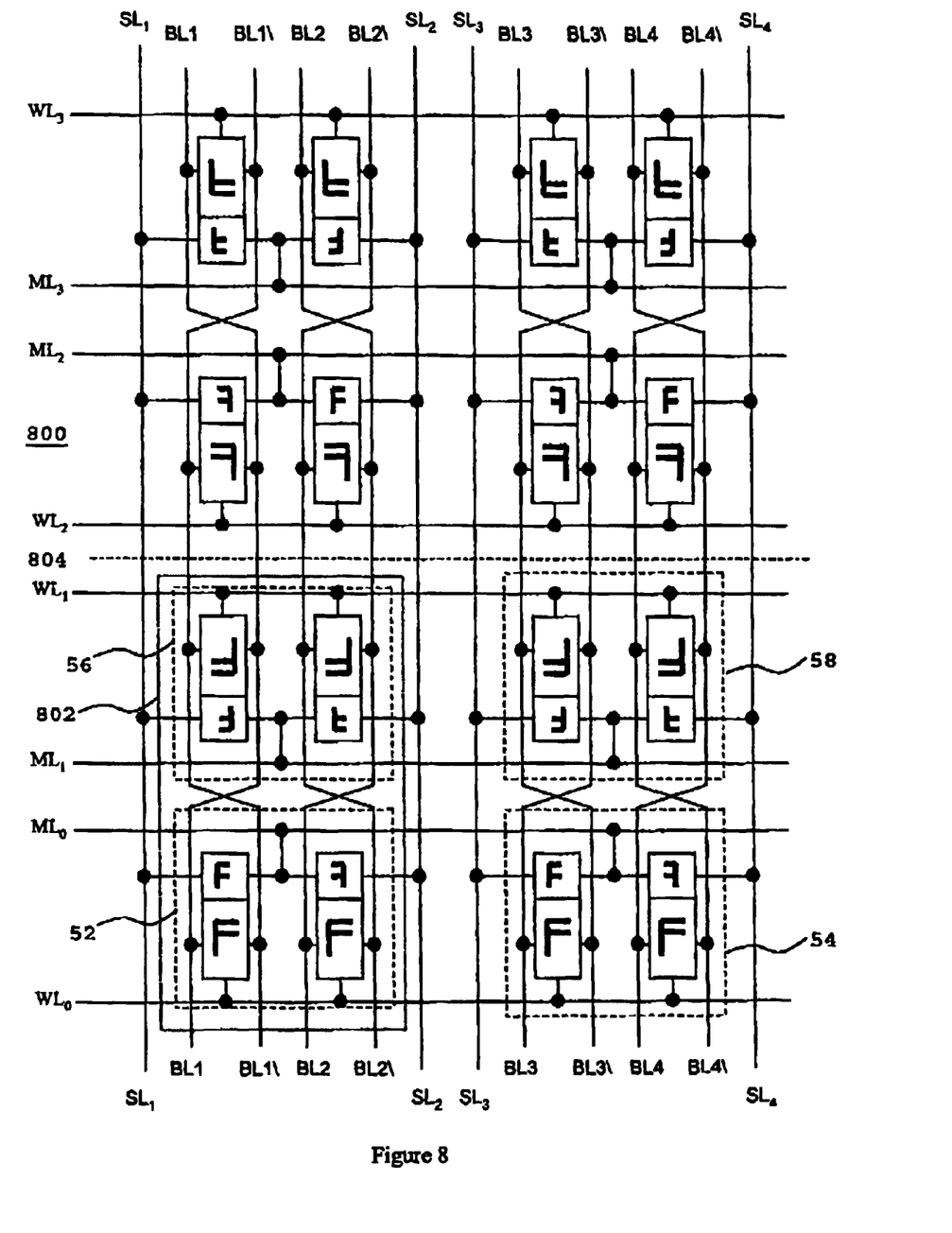
FIG. 8 illustrates a schematic diagram of a simplified CAM cell array implementing the CAM cell orientation illustrated in FIG. 4B.

Referring to FIG. 8, the CAM cell layout of FIGS. 4B and 7 is illustrated generally by numeral 800. The CAM cell layout 800 includes bitlines BL1, BL1\, BL2, BL2\, BL3, BL3\, BL4, and BL4\, wordlines $WL_0$, $WL_1$, $WL_2$, and $WL_3$, searchlines $SL_0$, $SL_1$, $SL_2$, and $SL_3$, and matchlines $ML_0$, $ML_1$, $ML_2$, and $ML_3$. In FIG. 8, a larger "F" illustrates the storage portion of each half-cell and a smaller "F" illustrates the search portion of each half-cell. Cells 52, 54, 56, and 58 from FIG. 4B are shown for reference. The combination of cells 52 and 54 are used as a base unit 802 for the layout of the CAM cell array portion 800. The base unit 802 is tiled to extend the CAM cell array portion 800 in a horizontal direction. To extend the CAM cell array portion 800 in a vertical direction, the base unit 802 is mirrored about a vertical axis 804. Referring to FIG. 8, it should be noted that every time a storage portion in a row is adjacent to a storage portion of another row, as illustrated between $WL_1$ and $WL_2$, the two adjacent storage portions mirrored about a horizontal axis such as 804. In the case where storage portions are not adjacent to one another as in the case of $WL_0$ and $WL_1$, the storage portions are rotated 180 degrees in relation to one another.

Figure 9:
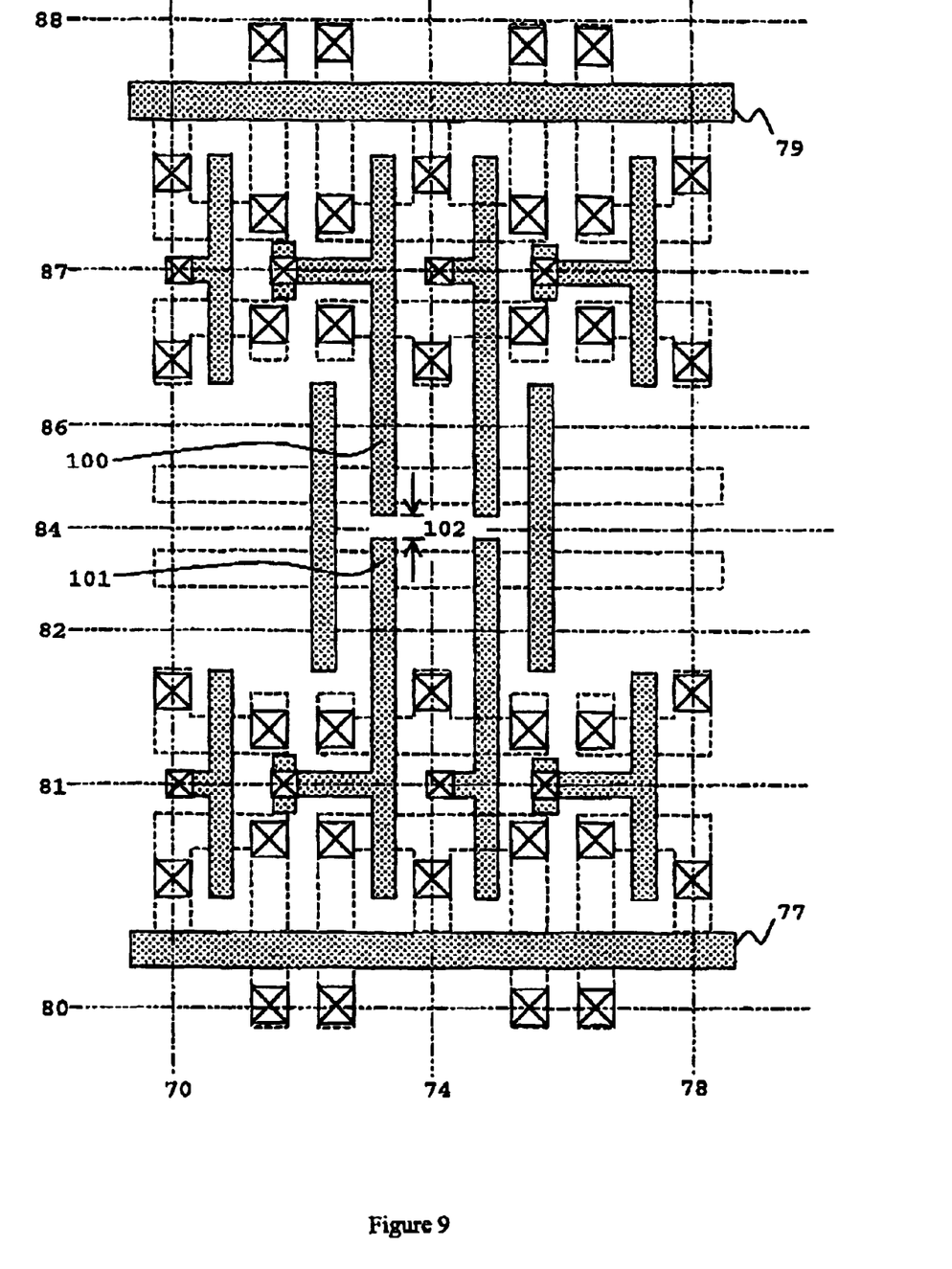
FIG. 9 illustrates a schematic diagram of a layout of the CAM cell orientation illustrated in FIG. 3A.

Referring to FIG. 9 a layout of two ternary SRAM-based CAM cells in accordance with yet an alternate embodiment of the present invention is illustrated generally by numeral 900. Specifically, the layout corresponds to the orientation illustrated in FIG. 3A. Generally, the storage portion of each half-cell is located between horizontal axes 80 and 82 for the lower cells and horizontal axis 86 and 88 for the upper cells respectively. For example, the storage portion 32a of the first half of ternary cell 32 is located between horizontal axes 80 and 82 and vertical axes 70 and 74. As illustrated by the layout of the active semiconductor regions, the storage portion in the first half-cell is tiled with respect to vertical axis 74 to form the storage portion 32b of the second half of the ternary cell 32. The storage portion 32b of the second half of the ternary cell 32 is located between horizontal axes 80 and 82 and vertical axes 74 and 78. For the upper cells, the storage portion is a mirror image about horizontal axis 84 with respect to the storage portion of each corresponding lower cell.

Generally, the search portion of each half-cell is located between horizontal axes 82 and 84 for the lower cells and horizontal axis 84 and 86 for the upper cells respectively. For example, the search portion 32a' of the first half of the ternary cell 32 is located between horizontal axes 82 and 84 and vertical axes 70 and 74. As illustrated by the layout of the active semiconductor regions, the search portion in the first half-cell is mirrored about the vertical axis 74 to form the search portion 32b' of the second half of the ternary cell 32. The search portion 32b' of the second half of the ternary cell 32 is located between horizontal axes 82 and 84 and vertical axes 74 and 78. For the upper cells, the search portion is a mirror image about horizontal axis 84 with respect to the search portion of each corresponding lower cell. Also illustrated in this figure are wordlines 77 and 79 corresponding to the lower and upper rows 40' and 42' respectively.

As illustrated in FIG. 9, the poly-to-poly spacing 102 between polysilicon portions 101 and 102 corresponding to the upper and lower rows sets a limit on the ability to pack the upper and lower cells together. In this non-twisted bitline implementation therefore, the spacing between upper and lower rows is limited by the poly-to-poly spacing between adjacent polysilicon portions in the upper and lower rows. Conversely, in the twisted bitline configuration shown in FIG. 5, this problem does not exist. The poly-to-poly spacing is much wider due to the fact that the search portions in the upper and lower rows are in fact rotated by 180 degrees. Hence, using the twisted bitline configuration in combination with the selective orientation of the storage and search portions as shown in FIG. 5 results in the most optimal cell array layout.

Figure 10:
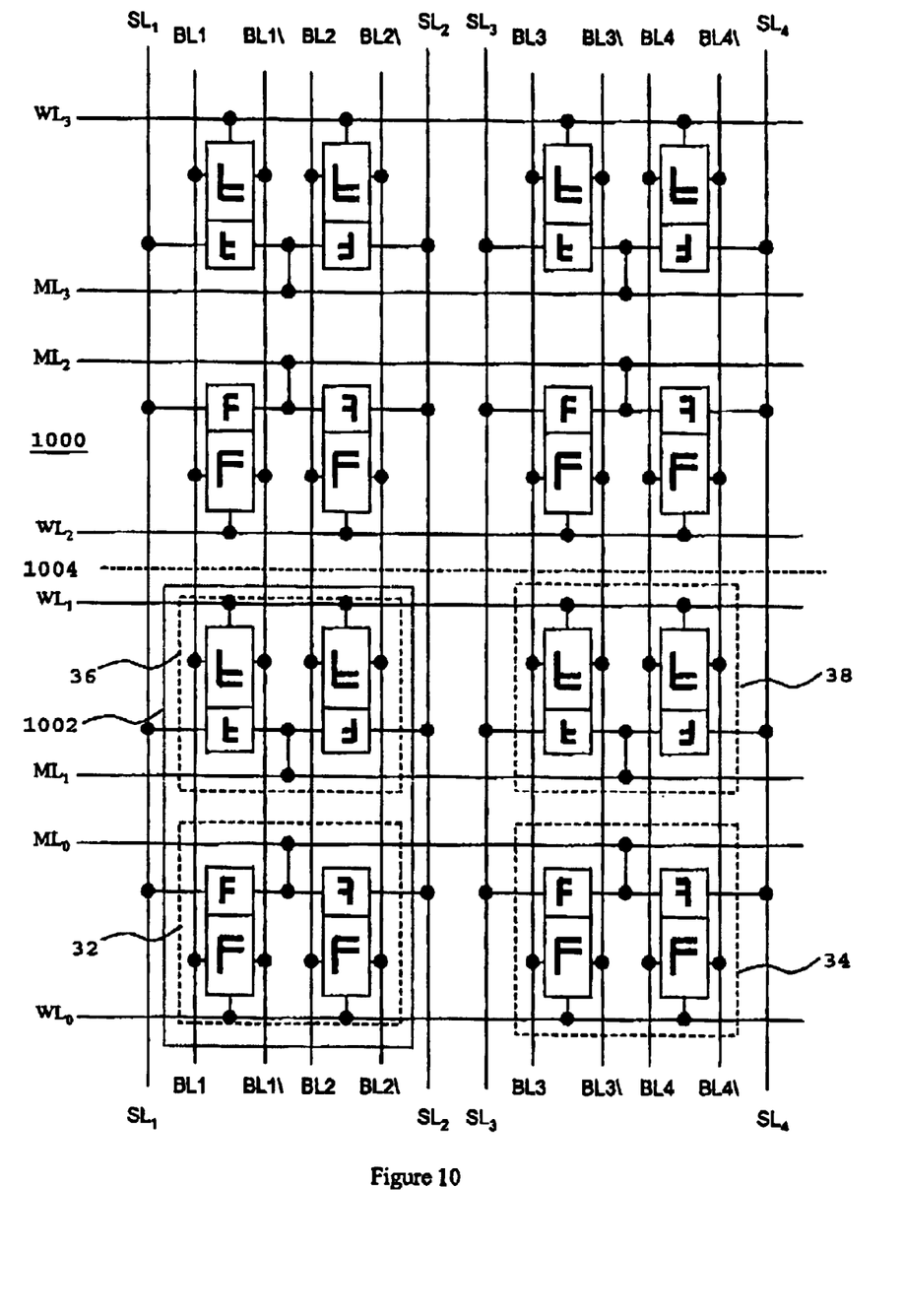
FIG. 10 illustrates a schematic diagram of a simplified CAM cell array implementing the CAM cell orientation illustrated in FIG. 3A.

Referring to FIG. 10, the CAM cell layout of FIG. 3A is illustrated including bitlines, wordlines and matchlines. As illustrated in these diagrams, the cell array is constructed using non-twisted, rather than twisted bitlines as described with reference to FIG. 9.

While the previous embodiments are described with reference to ternary CAM cells using n-channel devices in the comparison circuit, after reviewing Applicant's copending application Ser. No. 09/894,900 it will be apparent to person skilled in the art that p-channel devices may also be used for the comparison circuit.

Further, it will be apparent to one skilled in the art that although the selective orientation of portions of a half-cell has been described within the context of CAM cells, other circuit implementations can also be used to implement the present invention. Generally, this applies to circuit implementations having repetitive circuit blocks that can be readily segmented into multiple portions of repetitive circuit blocks.

For example, in the context of standard cells used in Application Specific Integrated Circuits (ASICs), the layout of such standard cells is often automated and implemented using place and route software. Improvements to standard cell layout can be achieved by employing the present invention. Specifically, standard cells can be segmented into multiple portions, with some portions benefiting more from node sharing than other portions. The portions eligible to benefit more from node sharing arrangements can be mirrored as described in the example of FIG. 3A, while portions not as readily eligible to benefit from node sharing can be tiled as also described in FIG. 3A. The mirroring and tiling of predetermined portions of standard cells can be programmed and implemented in the place and route software to achieve the aforementioned benefits while still employing an automated layout system for standard cells.

In addition to standard cell implementations and content addressable memory applications, one skilled in the art will appreciate that any repetitive circuit blocks which can be readily segmented into multiple portions, be they in memory, microprocessor or programmable logic devices can therefore benefit from implementing the principles of the present invention.

While several configurations have been described for illustrative purposes, a person skilled in the art will appreciate other possible configurations as may be dictated by implementation-specific requirements. Thus, although the invention has been described with reference to certain specific embodiments, various modifications thereof will be apparent to those skilled in the art without departing from the spirit and scope of the invention as outlined in the claims appended hereto.

What is claimed is:

1. A semiconductor circuit array comprising:
   a plurality of memory cells, each of the memory cells including a first, a second, a third and a fourth segments, the first and second segments forming a first half of a memory cell and the third and fourth segments forming a second half of a memory cell, wherein the third segment is a mirror image of the first segment, and the fourth segment is a tiled image of the second segment.

2. The semiconductor circuit as defined in claim 1, wherein the first and third segments comprise a search portion of the memory cell.

3. The semiconductor circuit as defined in claim 1, wherein the second and fourth segments comprise a storage portion of the memory cell.

4. The semiconductor circuit as defined in claim 1, wherein the first and third segments comprise a search portion of a content addressable memory (CAM) cell.

5. The semiconductor circuit as defined in claim 1, wherein the second and fourth segments comprise a storage portion of a content addressable memory (CAM) cell.

* * * * *